(12) United States Patent
Patel et al.

(10) Patent No.: US 11,439,038 B2
(45) Date of Patent: Sep. 6, 2022

(54) OUTDOOR VENTILATED ENCLOSURE

(71) Applicant: Hammond Power Solutions, Inc., Guelph (CA)

(72) Inventors: Dhiru S. Patel, Guelph (CA); Kevin Van Dekerkhove, Guelph (CA)

(73) Assignee: Hammond Power Solutions, Inc., Guelph (CA)

( * ) Notice: Subject to any disclaimer, the term of this patent is extended or adjusted under 35 U.S.C. 154(b) by 694 days.

(21) Appl. No.: 16/044,842

(22) Filed: Jul. 25, 2018

(65) Prior Publication Data
US 2019/0037727 A1 Jan. 31, 2019

Related U.S. Application Data

(60) Provisional application No. 62/538,406, filed on Jul. 28, 2017.

(51) Int. Cl.
| | | |
|---|---|---|
| *E06B 7/082* | (2006.01) | |
| *H05K 7/20* | (2006.01) | |
| *H02B 1/56* | (2006.01) | |
| *H02B 1/28* | (2006.01) | |
| *H01F 27/02* | (2006.01) | |
| *E06B 9/06* | (2006.01) | |

(52) U.S. Cl.
CPC ......... *H05K 7/20181* (2013.01); *E06B 7/082* (2013.01); *H01F 27/025* (2013.01); *H02B 1/28* (2013.01); *H02B 1/56* (2013.01); *E06B 9/0623* (2013.01)

(58) Field of Classification Search
CPC ............. H05K 7/20181; H05K 1/0201; H05K 1/0233; H05K 7/1458; H05K 7/20127; H05K 7/202; H05K 7/20; H05K 9/0041; E06B 7/082; E06B 9/0623; H01F 27/025; H01F 27/08; H01F 29/146; H02B 1/28; H02B 1/56; H02B 1/14; H02B 3/00; H02B 13/00; F24F 3/16; F24F 1/0073; F24F 1/035; F24F 13/08; F24F 13/082; F24F 13/085; F24F 13/28

USPC ........................................................ 454/184
See application file for complete search history.

(56) References Cited

U.S. PATENT DOCUMENTS

| | | | | |
|---|---|---|---|---|
| 2,820,407 A | * | 1/1958 | Smith ...................... | F24F 13/08 454/279 |
| 5,559,673 A | * | 9/1996 | Gagnon ................... | G06F 1/20 165/122 |

(Continued)

*Primary Examiner* — Avinash A Savani
*Assistant Examiner* — Ryan L Faulkner
(74) *Attorney, Agent, or Firm* — Quarles & Brady LLP

(57) ABSTRACT

A louvered panel assembly restricts the ingress of contaminants into an enclosure. The louvered panel assembly includes a first louvered panel, a second louvered panel, and a third louvered panel. The first louvered panel has a first plurality of louvers extending arcuately, downwardly, and outwardly from a first plate. The second louvered panel is coupled to the first louvered panel and has a second plurality of louvers extending arcuately, downwardly, and inwardly away from a second plate that is spaced apart from the first plate. The third louvered panel is coupled to the second louvered panel and has a third plurality of louvers extending arcuately, upwardly, and inwardly away from a third plate that is spaced apart from and extends approximately parallel to the second plate.

16 Claims, 12 Drawing Sheets

(56) References Cited

U.S. PATENT DOCUMENTS 9,822,532 B2 * 11/2017 Sherry .................. F24F 13/085
2003/0050002 A1 * 3/2003 Pfister ................ H05K 7/20127
                                                           454/184

* cited by examiner

OUTDOOR VENTILATED ENCLOSURE

CROSS-REFERENCE TO RELATED APPLICATIONS

The present application claims priority to U.S. Provisional Patent Application No. 62/538,406, filed Jul. 28, 2017, entitled "Outdoor Ventilated Enclosure," which is hereby incorporated by reference in its entirety.

STATEMENT REGARDING FEDERALLY SPONSORED RESEARCH

N/A

BACKGROUND

Dry type transformers are electromagnetic devices for stepping up or down the supply voltage. When in operation, magnetic flux circulating in the core and electrical current circulating in the coil conductors produce losses in terms of heat. The cooler ambient air enters at the bottom of coils, passes through cooling ducts in the coils through thermosiphon action, and carries heat away from the coils as it exits at the top of the coils.

Dry type transformers can be used in both indoor and outdoor applications. When used in an indoor application, the dry type transformer is typically installed inside a building, in an indoor ventilated enclosure. Ambient air can enter the enclosure bottom ventilation, cooling the coils as it passes through the coils, then exit through the enclosure top ventilation.

Due to the possibility of weather that could damage dry type transformers (e.g., snow, rain, high winds), dry type transformers used in outdoor applications are typically installed in non-ventilated enclosures. The non-ventilated enclosure provides protection to the dry type transformer from falling and blowing rain, snow, and dust. This protection comes at a cost, however, as cooler ambient air cannot freely enter inside the non-ventilated enclosure. As a result, the cooling of the coils is not very effective, and other cooling techniques must be employed. For example, much larger conductors may be used to reduce heat produced by the transformer. Accordingly, non-ventilated dry type transformers are much higher in cost.

Alternatively, some outdoor applications for dry type transformers have incorporated ventilated enclosures that can provide a degree of protection from falling rain and snow. Such enclosures may be designed according to NEMA 250, CSA C92.2, or other national regulatory standards. These enclosures provide some protection against falling rain or snow where the angle of incidence to ventilation is not more than 45 degrees to vertical. Unfortunately, snow and water can and do enter this type of enclosure during windy conditions. Electrical equipment housed in the enclosure may be impacted by this intrusion of water and snow, and may be damaged as a result.

Accordingly, a need exists for an outdoor ventilated enclosure that can provide sufficient ventilation while providing improved protection from precipitation, wind, and other outdoor elements.

SUMMARY

Some embodiments of the invention provide an outdoor ventilated enclosure capable of providing ventilation to a dry type transformer, while simultaneously providing protection from precipitation, wind, and other unwanted contaminants. In some embodiments, the outdoor ventilated enclosure is capable of withstanding wind conditions approaching and exceeding 90 km/hour, while maintaining ventilation and protection from rain, snow, other precipitation, or other contaminants that could be harmful to a dry type transformer.

In some embodiments, a louvered panel assembly for restricting the ingress of contaminants into an enclosure is provided. The louvered panel assembly includes a first louvered panel having a first plurality of louvers extending arcuately, downwardly, and outwardly away from a first plate. A second louvered panel is coupled to the first louvered panel. The second louvered panel includes a second plurality of louvers extending arcuately, downwardly, and inwardly away from a second plate that is spaced apart from the first plate. A third louvered panel is coupled to the second louvered panel. The third louvered panel includes a third plurality of louvers extending arcuately, upwardly, and inwardly away from a third plate. The third plate extends approximately parallel to the second plate.

Optionally, the louvered panel assembly further includes a primary filter received between the first plate and the second plate. A secondary filter may also be received between the second plate and the third plate. The first plate and the second plate can be spaced apart by a first distance, while the second plate and third plate can be spaced apart by a second distance that is longer than the first distance. For example, the second distance can be at least 2.5 times larger than the first distance. In some embodiments, the secondary filter is positioned proximate the third plate and spaced apart from the second plate.

In some embodiments, a first plurality of openings are formed between a distal end of one of the first plurality of louvers and the first plate. A second plurality of openings can be formed between a distal end of one of the second plurality of louvers and the second plate. In some embodiments, the first plurality of openings are vertically offset from the second plurality of openings. For example, each of the first plurality of openings can be vertically offset from each of the second plurality of openings by a distance of between 3 and 8 times larger than a vertical length of each of the first plurality of openings. In some embodiments, a third plurality of openings are formed between a distal end of one of the third plurality of louvers and the third plate. The first plurality of openings, the second plurality of openings, and the third plurality of openings may each be vertically offset from one another.

Each louver in the first plurality of louvers, the second plurality of louvers, and the third plurality of louvers can be uniformly shaped. Openings can be formed between a distal end of each louver and each plate from which the louver extends. Each louver can have a vertical length of between about 8 and 12 times larger than a vertical length of each opening.

An outdoor ventilated enclosure for housing and protecting a transformer is also disclosed. The enclosure comprises a plurality of walls and a louvered panel assembly coupled to at least one of the plurality of walls. The plurality of walls define a cavity, which can receive a transformer. The louvered panel assembly defines a fluid flow path through at least one wall (i.e., the wall supporting the louvered panel assembly) to the cavity. The louvered panel assembly includes a first louvered panel, a second louvered panel, and a third louvered panel. The first louvered panel includes a first plurality of louvers extending outwardly and downwardly away from a first plate. The first plate extends approximately parallel to the wall. The second louvered panel is coupled to and positioned inward from the first louvered panel. The second louvered panel has a second plurality of louvers extending downwardly and inwardly from a second plate toward the cavity. The second plate extends approximately parallel to the first plate. The third louvered panel is coupled to and positioned inward from the second louvered panel. The third louvered panel has a third plurality of louvers extending upwardly and inwardly away from a third plate, toward the cavity. The third plate extends approximately parallel to the second plate.

In some embodiments, a primary filter is positioned between the first plate and the second plate, and a secondary filter is positioned between the second plate and the third plate. Optionally, the secondary filter is positioned proximate the third plate and spaced apart from the second plate. A drip shield can be coupled to the third louvered panel. The drip shield can extend forwardly beyond and above the first plurality of louvers. A drip edge can also be incorporated into the enclosure. The drip edge can be coupled to a top wall of the enclosure. The drip edge can extend above and forwardly beyond the louvered panel assembly. A storm guard assembly can be removably received about the perimeter of the louvered panel assembly. The storm guard assembly can be defined by a hollow, open-base trapezoid shape.

DETAILED DESCRIPTION

Figure 1:
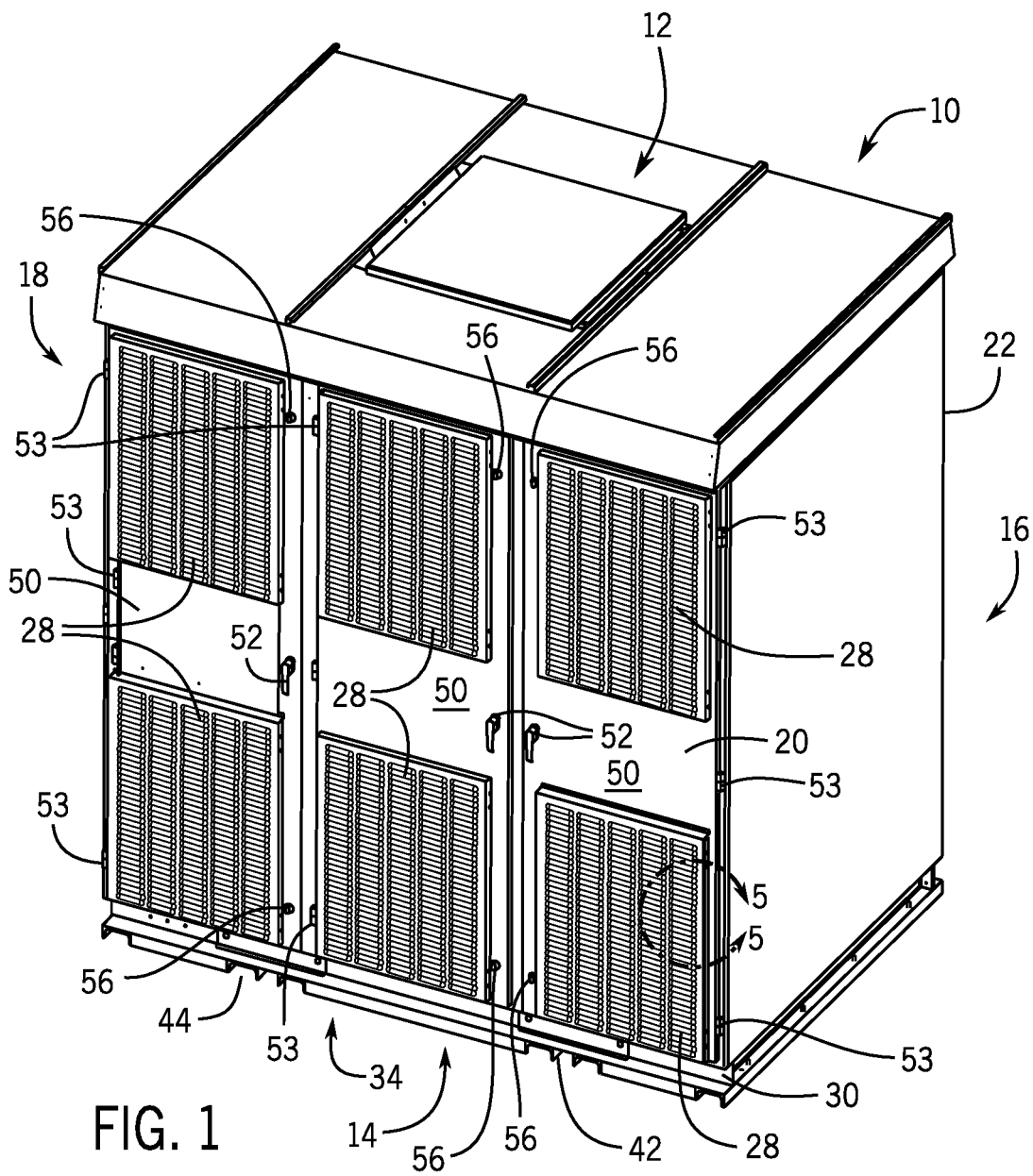
FIG. 1 is a top isometric view of an outdoor ventilated enclosure according to one embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

FIG. 1 illustrates an outdoor ventilated enclosure 10 according to one embodiment of the invention. The outdoor ventilated enclosure 10 can have a generally rectangular box-like shape that is adapted to enclose electrical equipment, such as a dry-type transformer, for example. The outdoor ventilated enclosure 10 can include a top side 12, a bottom side 14, a right side 16, a left side 18, a front side 20, and a back side 22, which together define a cavity 24 that can receive, surround, and protect a dry-type transformer (e.g., transformer 26, shown in FIG. 4) in many weather scenarios. The outdoor ventilated enclosure 10 can be formed generally of corrosion resistant sheet metal or other corrosion resistant materials, including aluminum, stainless steel, thermoplastics (e.g., PVC, ABS, UMHWPE, HDPE, etc.), or composite materials, such as fiberglass.

One or more of the enclosure sides 12, 14, 16, 18, 20, 22 can be made of solid, uniform panels, while one or more of the remaining sides 12, 14, 16, 18, 20, 22 can include louvered panel assemblies 28. The sides 12, 14, 16, 18, 20, 22, or panels, can be bolted to a support frame 30, which reinforces the panels 12, 14, 16, 18, 20, 22 in windy conditions. The support structure 30 can have a cage-like shape and can similarly be formed of aluminum or other non-corrosive materials capable of providing strength and durability to withstand outdoor conditions. Gaskets (not shown) can be positioned and compressed between the mating surfaces of each panel 12, 14, 16, 18, 20, 22 and the support frame 30 to seal the cavity 24 from outdoor elements, including precipitation, dust, and other unwanted contaminants.

Figure 4:
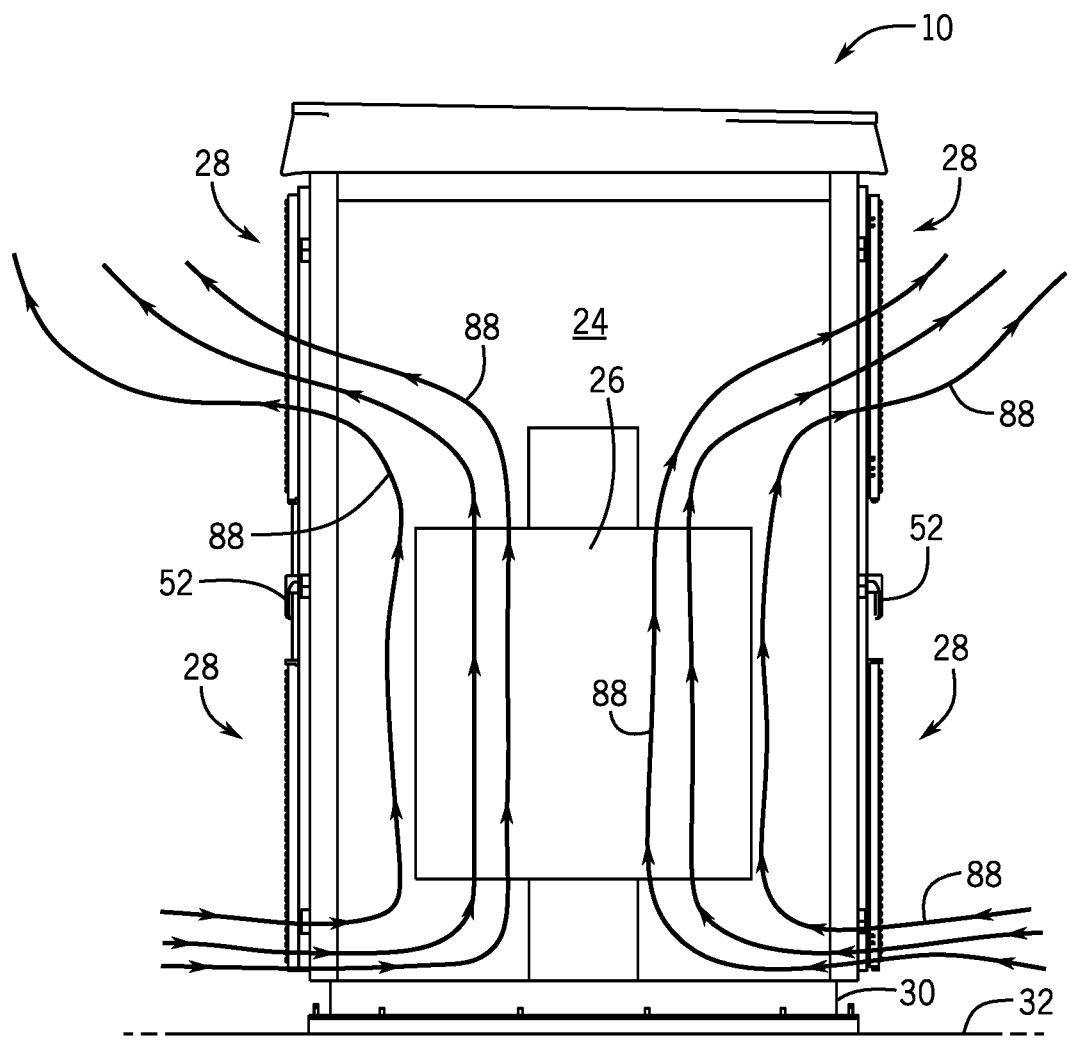
FIG. 4 is a schematic view of exemplary airflow patterns through the outdoor ventilated enclosure of FIG. 1.

The enclosure 10 is generally mounted or otherwise supported on a flat surface 32, such as concrete (shown in FIG. 4). Because the flat surface 32 may extend outward beyond the footprint of the enclosure 10, the flat surface can accumulate precipitation or contaminants that are advantageously excluded from the cavity 24 of the enclosure. To prevent contaminants from easily accessing the cavity 24 (and therefore, the transformer 26), various base structures 34, 36, 38 can be used to either suspend the enclosure 10 off the flat surface 32 or seal the cavity 24 of the enclosure 10 from the flat surface 32, as demonstrated in FIGS. 2A-2C.

Figure 2A:
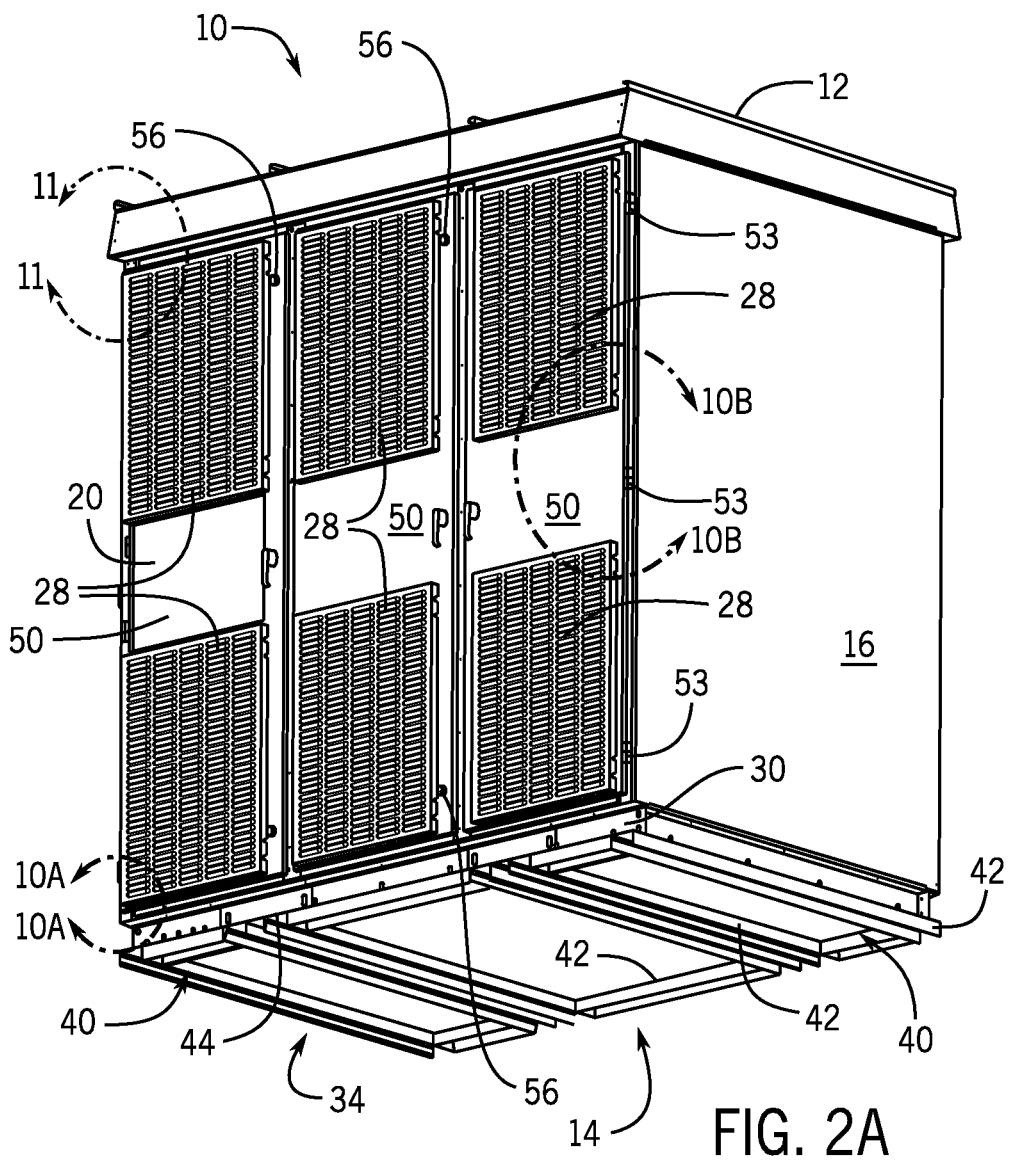
FIG. 2A is a bottom perspective view of the outdoor ventilated enclosure of FIG. 1.

As shown in FIG. 2A, a first embodiment of a base structure 34 that can be coupled to the enclosure 10 is shown. The base structure 34 can be formed of angle or channel stock 40, for example, which can contact both the bottom panel 14 and the flat surface 32 to both suspend and support the bottom panel 14 of the enclosure 10. In some aspects, the flanges 42 are configured to engage the flat surface 32, while the main section 44 of the channel stock 40 sits flush against the bottom panel 14. Accordingly, the bottom panel 14 (and the enclosure 10) sits above the flat surface 32 by a distance equal to the flange height. The raised bottom panel 14 can then be sealed with the remaining panels 12, 16, 18, 20, 22, such that the cavity 24 is kept free of the elements and not subjected to precipitation or contaminants that may otherwise enter into the enclosure 10 due to extended periods of continuous exposure.

Figure 2C:
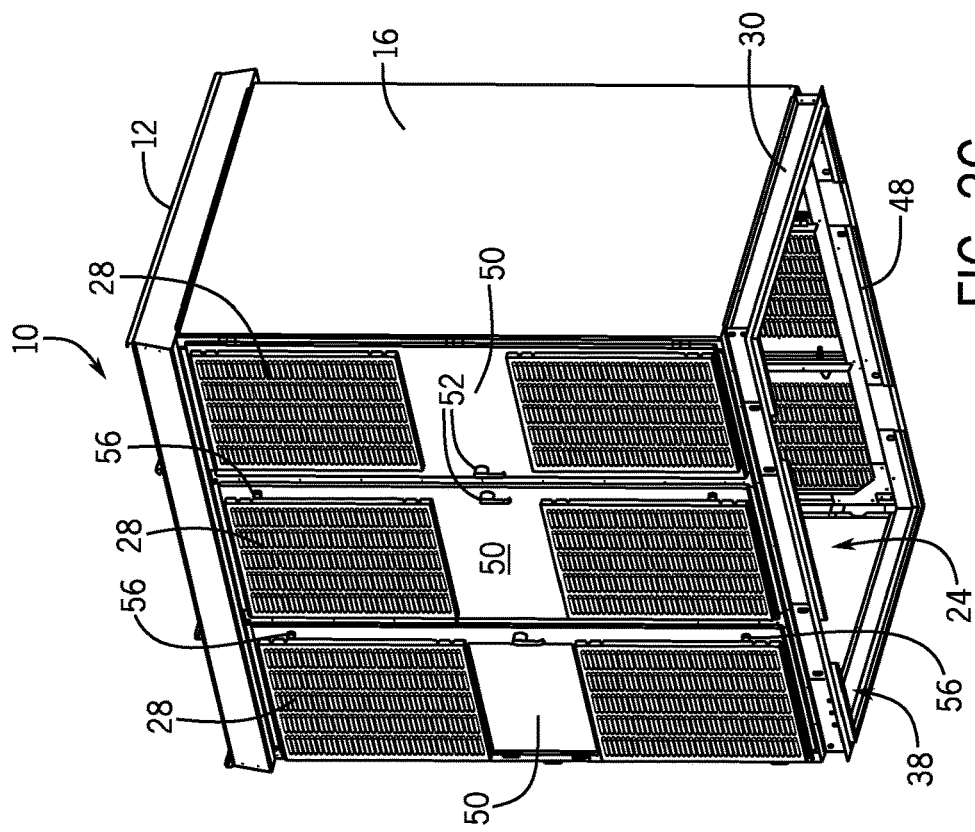
FIG. 2C is a bottom perspective view of the outdoor ventilated enclosure of FIG. 1 having yet another alternate bottom assembly.
Figure 2B:
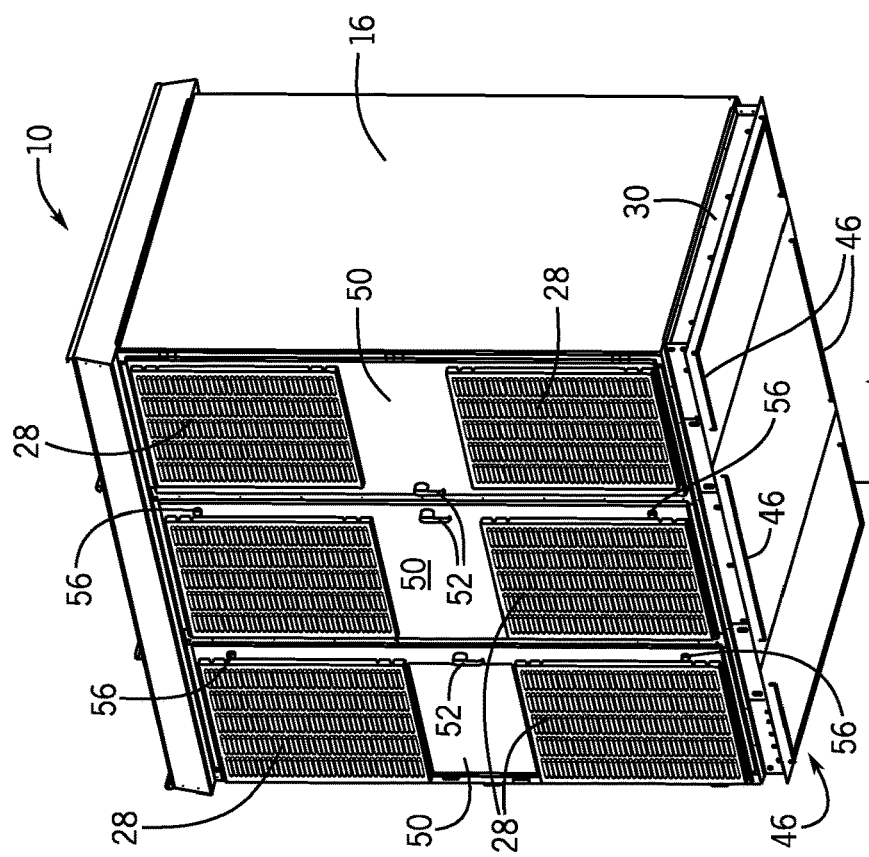
FIG. 2B is a bottom perspective view of the outdoor ventilated enclosure of FIG. 1 having an alternate bottom assembly.

The base structure 36 shown in FIG. 2B relies upon many of the same principles as the base structure 34. Legs 46 extend outwardly away from a flat, continuous bottom panel 14 to suspend the panel 14 off of the flat surface 32. The legs 46 can be round stock formed of a non-corrosive material, and can be welded or otherwise joined to the flat bottom panel 14. The legs 46 can extend around a portion of the perimeter of the bottom panel 14, balancing the enclosure 10 while also reducing the required materials.

Raising the enclosure 10 off of the flat surface 32, as done by the base structures 34, 36, can provide a variety of positive outcomes. By suspending the enclosure 10 from the flat surface, continuous contact with precipitation or contaminants that could pool on the flat surface 32 is avoided. The base structures 34, 36 also have discontinuities in structure, such that air circulation can be achieved underneath the enclosure 10. The air circulation beneath the bottom panel 14 can help prevent corrosion to the base structures 34, 36 and the bottom panel 14 that may otherwise occur in a stagnant environment.

Alternatively, the bottom panel 14 can be omitted, as shown in FIG. 2C. The support structure 38 can then include a perimeter gasket 48 extending along the bottoms of the right, left, front, and back panels 16, 18, 20, 22, which each engage the flat surface 32. The weight of the enclosure 10 causes the gasket 48 to compress, thereby providing a substantially leak-free seal of the cavity 24 from the external environment. The gasket 48 can be an air bulb gasket, for example, which is formed of an elastomeric or otherwise resilient material. This support structure 38 design reduces material required to produce the enclosure, and can be advantageous in scenarios where existing transformers are preferably left in place. The enclosure 10 can then be raised above and lowered over the transformer, which may greatly reduce installation time for the enclosure 10. Once lowered into place and released (e.g., using a crane), the enclosure 10 becomes sealed against the flat surface 32.

Figure 3:
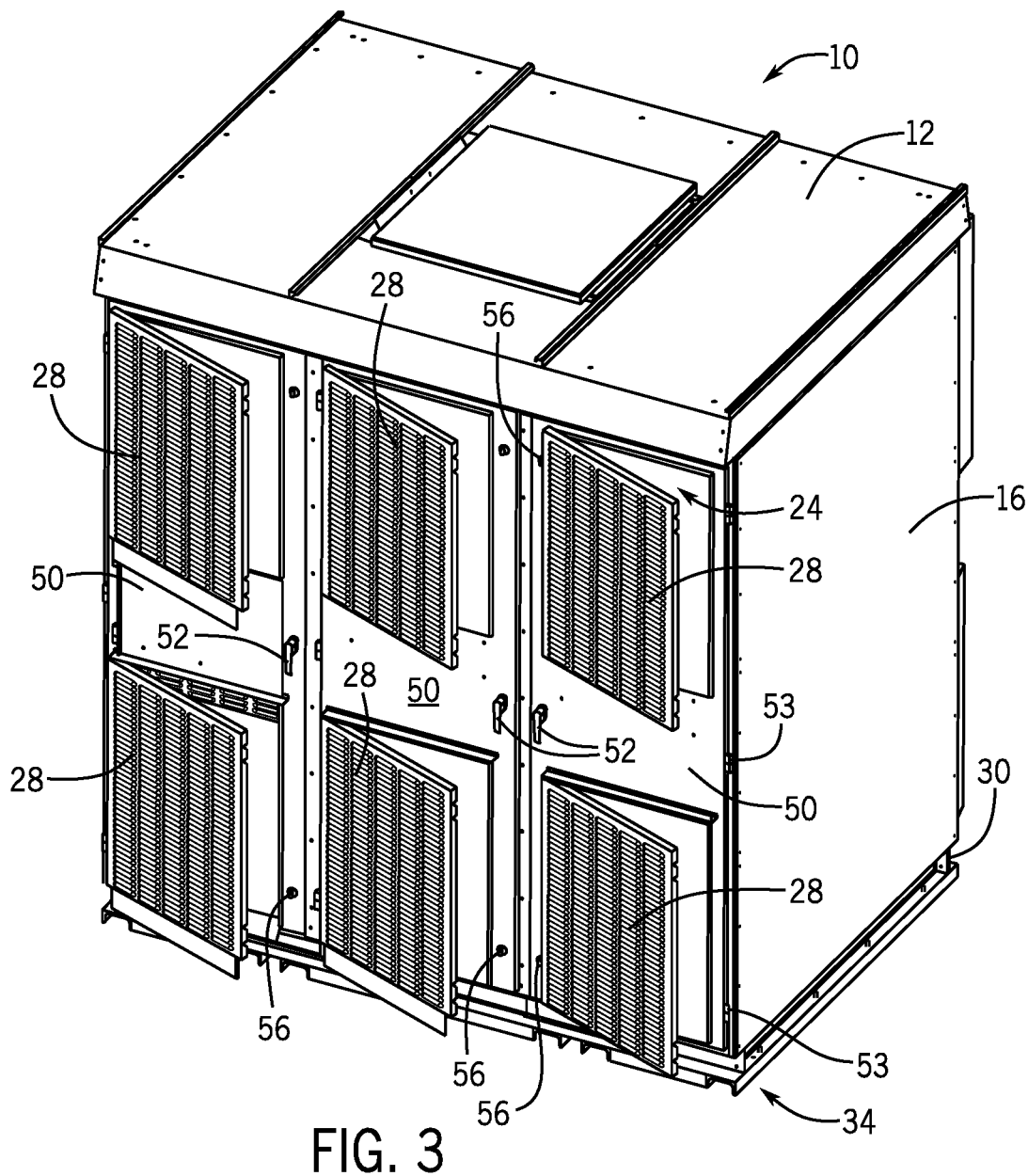
FIG. 3 is a top isometric view of the outdoor ventilated enclosure of FIG. 1 with a plurality of hinged louvered panels in an open position.

As mentioned previously, at least one of the panels 12, 14, 16, 18, 20, 22 includes a louvered panel assembly 28. In the illustrative example, the front panel 20 and back panel 22 each include several louvered panel assemblies 28, which can be coupled to the panels 20, 22 or to the support structure 30, depending upon the mounting mechanism employed by the design. In some examples, the panels 20, 22 are formed with several cabinet-style doors 50 that are hingedly coupled to the support frame 30. The doors 50 can be lockable, and can have rotatable handles 52 which can serve to open and close the cabinet doors 50. Hinges 53 coupled to the support structure 30 or other portion of the panels 20, 22 can anchor the doors 50 to the enclosure 10. As shown in FIG. 3, the hinges 53 can be placed on either side of the door 50. The doors can swing about the hinges 53 to selectively allow access into the cavity 24 and transformer contained therein. The one or more louvered panels 28 can be hingedly or otherwise coupled to the doors 50. In some embodiments, hinges (not shown, hidden in louvered panel assembly 28) are used to rotatably couple one or more louvered panel assemblies to the doors 50 and to the outdoor ventilated enclosure 10, generally. The hinged rotation of the louvered panel assemblies 28 relative to the doors 50 can allow components of the louvered panel assembly 28 to be easily cleaned, replaced, or otherwise maintained, while also restricting access into the cavity 24. A rotating latch 56, which can be part of a three-point latch system, can be used to selectively engage the door 50 to the support frame 30. In other examples, the panels can be bolted or welded, for example, to the support structure 30 or panels 16, 18, 20, 22, for example.

With additional reference to FIGS. 5-10B, louvered panel assemblies 28 are shown in additional detail. The louvered panel assemblies 28 can include a series of louvered panels 58, 60, 62 and, in some embodiments, filters 64, 66, that are offset from one another and spaced apart from one another to restrict precipitation and other contaminants from entering into the cavity 24 and reaching the transformer 26 contained therein. The series of louvered panels 58, 60, 62 and filters 64, 66 are designed to reduce the momentum of particles entering into the louvered panel assembly 28 using a series of redirections, spacing, and filtration. The combination of louvered panels 58, 60, 62 and filters 64, 66 can help prevent damage to a dry-transformer contained within the cavity 24, even in extreme weather conditions, including blizzards, thunderstorms, dust-storms, and the like.

The louvered panel assemblies 28 each include a first louvered panel 58. The first louvered panel 58 is the outermost panel, and is typically directly exposed to the external environment when the doors 50 are closed on the enclosure 10. The first louvered panel 58 includes a series of louvers 68 that extend away from a plate 70 outwardly (relative to the cavity 24, for example) and downwardly. The louvers 68 can have an arcuate shape defined by a varying radius. The louvers 68 are spaced apart from one another on the plate 70 to define a series of openings 72. The openings 72 allow for the passage of air beyond the louvers 68 into the cavity 24, which can help to cool the transformer 26, as shown in FIG.

4 and discussed below. The openings 72 are such that precipitation and other contaminants can only enter beyond the louvers 68 and panel 70 if they are flying nearly perpendicular or generally upward toward the louvered panel assembly 28. The openings 72 can have a vertical length A of between about 0.1 cm and about 0.8 cm, for example.

Figure 5:
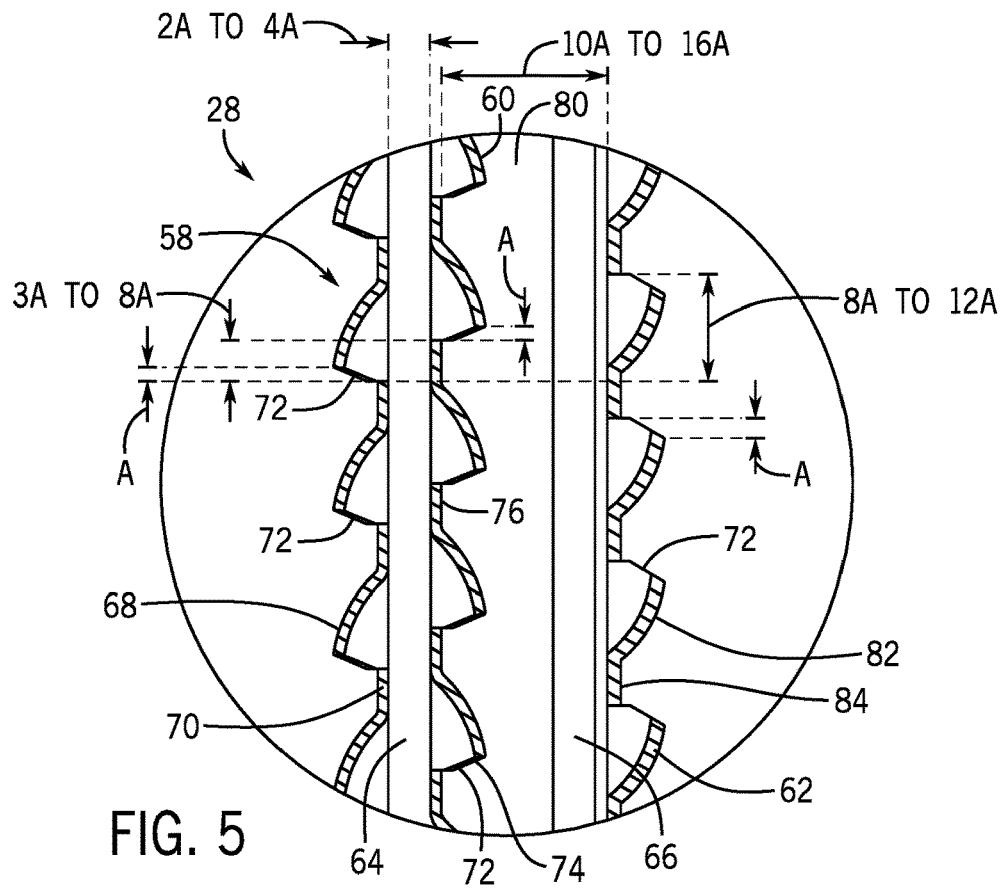
FIG. 5 is a side view of a louvered panel assembly that may be used on the panels of the outdoor ventilated enclosure of FIG. 1, taken from section 5-5 in FIG. 1.

A second louvered panel 60 can be included in the louvered panel assembly 28, and can be coupled to the first panel 58. As shown in FIG. 5, the second louvered panel 60 can include louvers 74 that generally oppose the louvers 68 formed on the first louvered panel 58. The louvers 74 can extend away from a plate 76 downward and inward toward the cavity 24. The louvers 74 and 68 can be vertically offset from one another. The vertical offset of the louvered panels 58, 60 can be between about 3 and 8 times the vertical length A, discussed above. The vertical offset between panels 58, 60 can further inhibit the travel of contaminants through the louvered panel assembly 28 by creating discontinuities in the fluid flow path. For example, if precipitation or some other contaminant managed to pass beyond the louvers 68 through one of the openings 72, the particle would likely contact the plate 76, which would greatly reduce the particle's momentum, given its perpendicular orientation to the particle's travel path.

The first louvered panel 58 and second louvered panel 60 can be horizontally offset from one another as well. In some embodiments, a space 78 is present between the louvered panels 58, 60. The space 78 can be defined by a horizontal distance around 2 to 4 times larger than the vertical length A. In some embodiments, a filter 64 is fitted into the space 78, and stretches between the louvered panels 58, 60. The filter 64 can be a fiberglass or HEPA filter, for example, which can serve to further reduce the momentum of unwanted particles entering the cavity 24. For example, particles being propelled in lighter winds (e.g., wind speeds below 40 kilometers per hour) can be trapped altogether in the filter 64 and prevented from traveling further inward to contact the second louvered panel 60 or, more importantly, the transformer within the enclosure 10. The filter 64 still allows air to pass through, however, which can provide a cooling effect to the transformer.

The louvered panel assembly 28 can include a third louvered panel 62 positioned inwardly away from the first and second louvered panels 58, 60. A space 80 can be present between the second louvered panel 60 and the third louvered panel 62, which can help for drainage and contaminant disposal, as explained below. The space 80 can be between about 10 times and about 16 times larger than the vertical length A of the louver slot openings 72 found in each louvered panel 58, 60, 62. The third louvered panel 62, like the other louvered panels 58, 60, can include a series of louvers 82 that extend away from a plate 84. The louvers 82 of the third louvered panel 62 can extend arcuately, upwardly and inwardly away from the plate 84, toward the cavity 24 of the enclosure 10. As illustrated, the louvers 68, 74, 82 of each louvered panel 58, 60, 62 can have a uniform shape, but at different orientations. The louvers 68, 74, 82 can be formed in series on the panels 58, 60, 62, having a vertical dimension approximately 8 to 12 times larger than the vertical length A of the louver slot openings 72. A vertical offset can be present between each set of louvers 82, 74, 68, which further obstructs the path of any particle that would otherwise enter the cavity 24. In the orientation shown, a particle would need to contact at least one, and almost certainly two louvers 68, 74, 82 in order to pass beyond the third louvered panel 62.

Optionally, a secondary filter 66 can be positioned between the second and third louvered panels 60, 62, within the space 80. The secondary filter 66 can be positioned proximate the third louvered panel 62, for example, and may occupy less than the entire space 80 between panels 60, 62. Like the primary filter 64, the secondary filter 66 can be a fiberglass or HEPA air filter, for example, that is adapted to remove particulate matter from air passing through the filter. Both the secondary filter 66 and primary filter 64 can be removably received within the louvered panel assembly 28, so that the filters 64, 66 can be periodically replaced over time.

With additional reference now to FIG. 4 and continued reference to FIGS. 5-9, the flow pattern of particles and contaminants contacting the louvered panel assemblies 28 is shown. The orientation, shape, and positioning of the louvered panels 58, 60, 62 slows the momentum of any possible particle by contacting each particle multiple times, redirecting the particles and breaking the wind velocity within the louvered panel assembly 28. The louvered panels 58, 60, 62 are also further configured to direct contaminants that pass inward beyond the first louvered panel 58 downward, where they can be effectively removed away from the enclosure.

Figure 6:
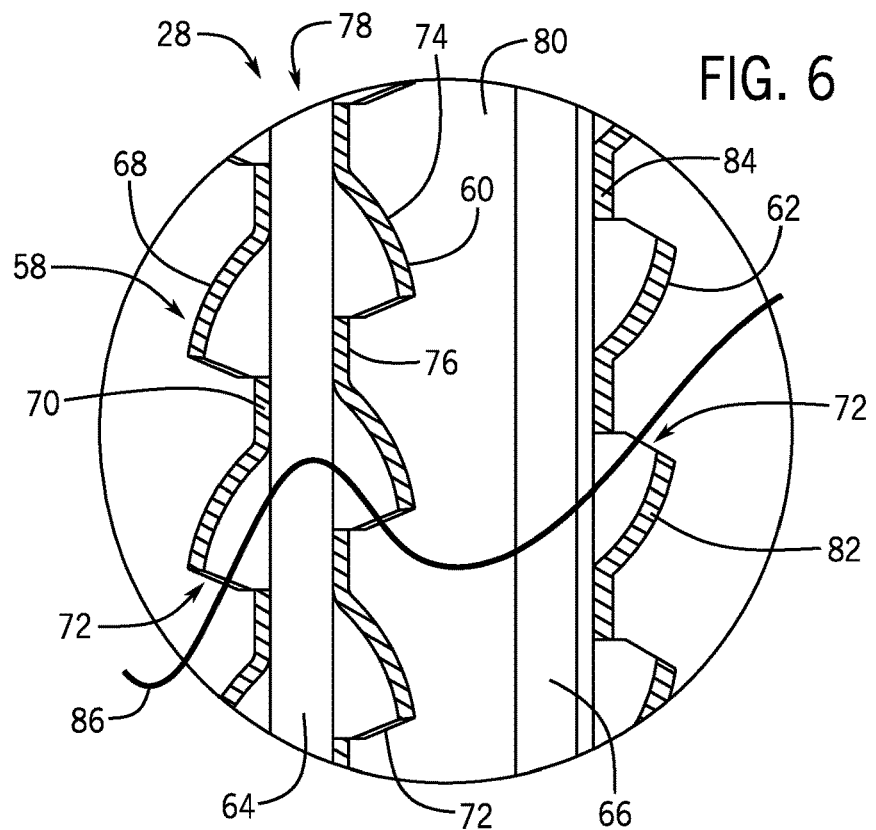
FIG. 6 is a side view of the louvered panel assembly from FIG. 5, showing the airflow pattern produced by the assembly.

Looking first at FIGS. 4 and 6, the natural flows 86, 88 of air are described. Wind-driven air can follow the natural flow-path shown in FIG. 6, where air enters through the openings 72 in the louvered panel 58, passes through the primary filter 64, through the second louvered panel 60, into the space 80, then through the secondary filter 66 and beyond the third louvered panel 62, where it can finally enter the cavity 24 of the enclosure. The louvers 68, 74, 82 shape and redirect the airflow several times, which reduces the energy (i.e., the velocity) of incoming air. The filters 64, 66 also slow down and filter the air flow 86 to ensure that contaminants do not reach the cavity 24. Additionally, the reduced air flow velocity maximizes the air flow cooling capacity.

The louvered panel assemblies 28 produce a natural cooling effect 88 for transformers 26 contained within the cavity 24 of the enclosure 10, as shown in FIG. 4. Air from near the bottom of the enclosure 10 flows inward, through a lower louvered panel assembly 28'. The air passes through the louvered panel assembly 28' in the flow path 86 described in FIG. 6. The air continues to flow inward where it can contact the warm outer surface of the transformer 26, contained within the cavity 24. As air passes along the transformer 26, it becomes heated and rises within the cavity 24. The air flow carries heated air upward, where it can then exit out a second, upper louvered panel assembly 28" present in the enclosure 10. This convective air flow 88 through the enclosure 10 acts as a thermo-siphon and naturally cools the transformer 26, while reducing transformer overheating and promoting prolonged use.

Figure 7:
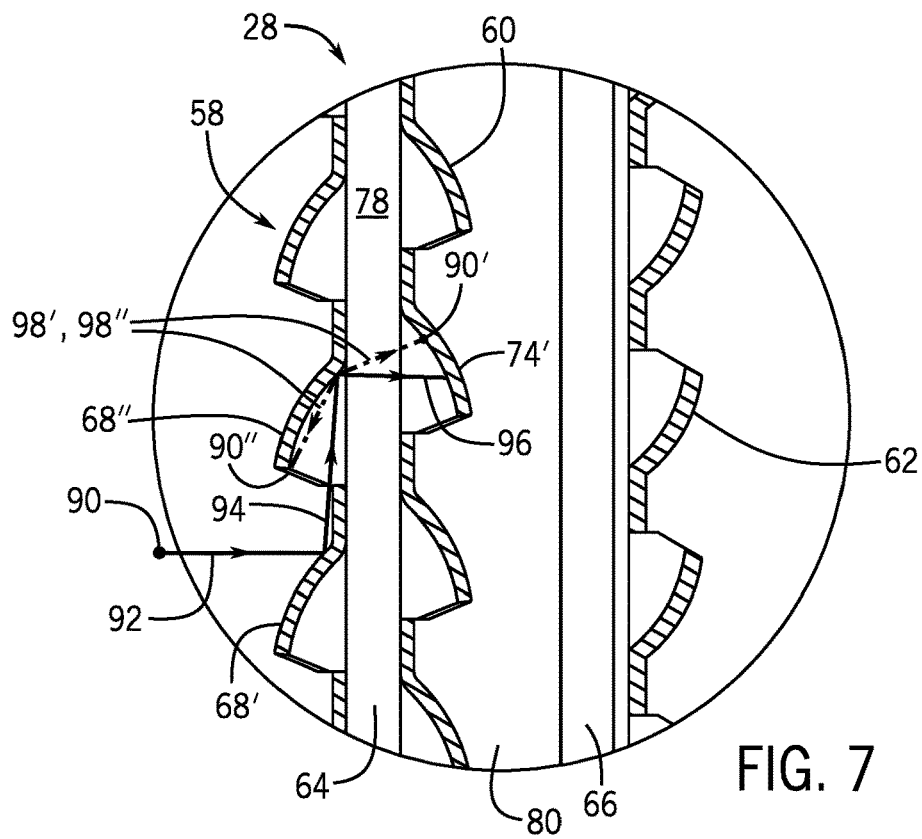
FIG. 7 is a side view of the louvered panel assembly from FIG. 5, showing the particle flow pattern produced by the assembly.
Figure 8:
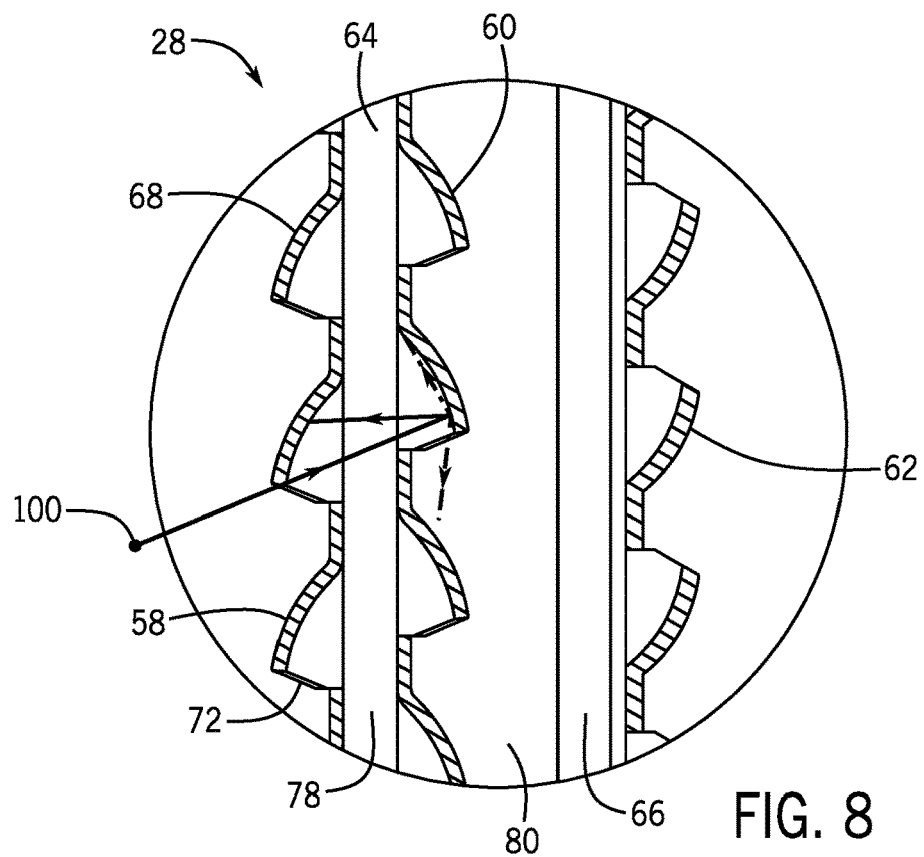
FIG. 8 is a side view of the louvered panel assembly from FIG. 5, showing an alternative particle flow pattern produced by the assembly.
Figure 9:
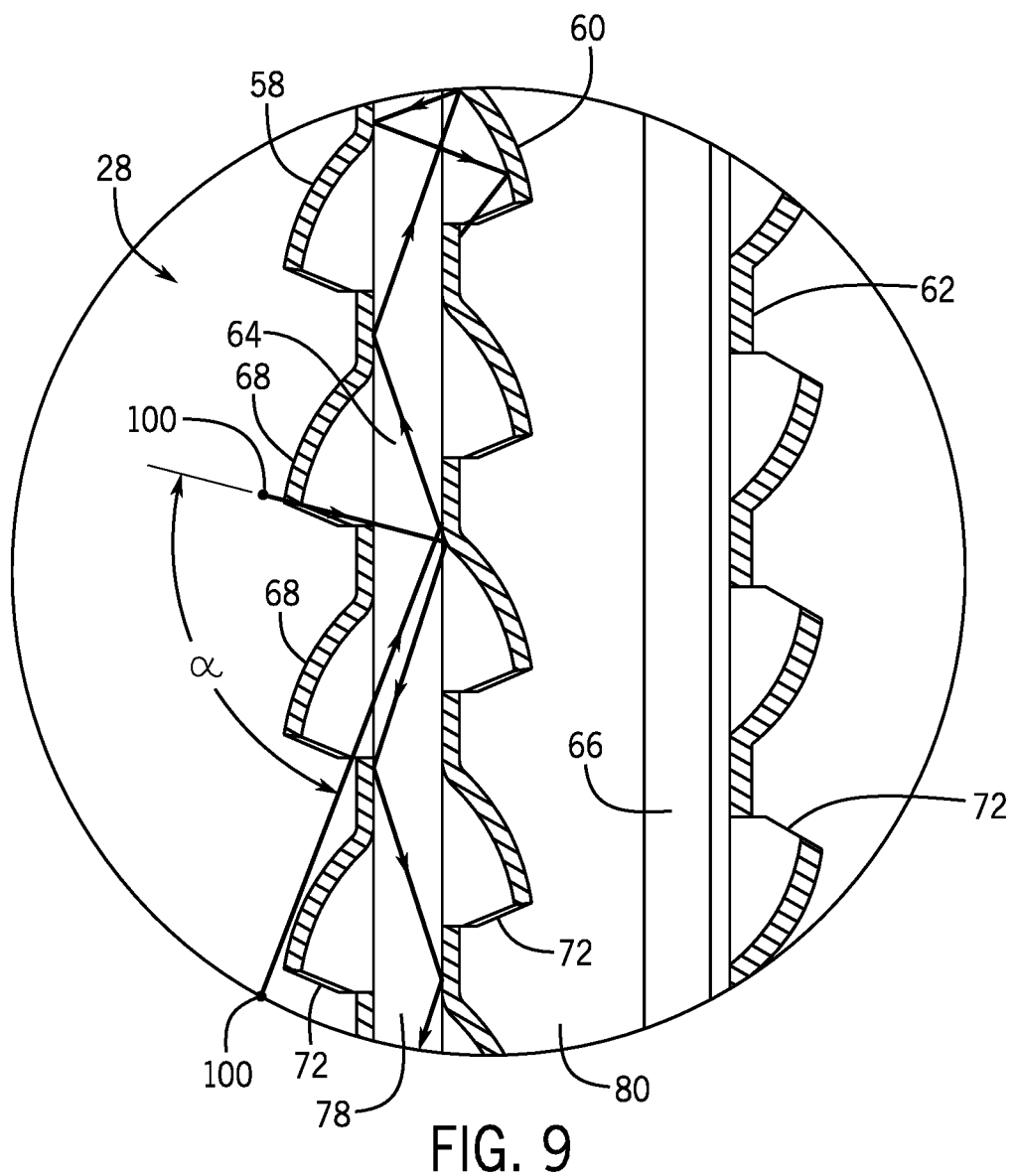
FIG. 9 is a side view of the louvered panel assembly of FIG. 5, showing an alternative particle flow pattern produced by the assembly.

Referring now to FIGS. 7, 8, and 9, the louvered panel assembly 28 is shown handling wind-blown contaminants. As described above, the positioning, orientation, and shape of each louvered panel 58, 60, 62 and filter 64, 66 prevents many contaminants from reaching the cavity 24 of the enclosure 10, inward from the innermost (e.g., the third) louvered panel 62. The vertical offset and shape of each louver 68, 74, 82, combined with the location and spacing between louver slot openings 72 in the assembly 28 causes wind-blown snow, rain, dust, or other contaminants to hit multiple louvered panels 58, 60, 62 as they try to enter the enclosure 10. The in-bound contaminants are redirected multiple times along the flow paths shown, reducing particle energy to a point where they can be directed outwardly away from the cavity 24 before they have a chance to contact or adversely affect the transformer 26.

Contaminants are redirected multiple times, regardless of the entry angle of the contaminant relative to the louvered panel assembly 28. For example, FIG. 7 illustrates a contaminant 90 entering the louvered panel assembly 28 along a pathway 92 approximately normal to the louvered panel assembly 28 (i.e., parallel to the flat surface 32 or ground below the enclosure 10). The contaminant 90 initially contacts an outer surface of the louver 68', which causes the contaminant 90 to angle slightly inward and upward, along a second portion of the pathway 94. The contaminant 90 then contacts an interior surface of a louver 68", which directs the contaminant 90 inward and slightly downward, through the filter 64 along the pathway 96. The filter 64 further reduces the momentum of the contaminant 90, until it comes into contact with an interior surface of a louver 74'. The redirection and filtration by the louvered panel assembly 28 has then reduced the energy of the contaminant 90 to the point where it no longer has sufficient energy to move inward beyond the second filter 66 or the third louvered panel 62, and cannot damage the transformer 26. In the case of precipitation, the contaminant 90 may follow a secondary flow path 98', 98", as contact with louvers 68', 68" can cause the contaminant 90 to splash and/or divide into multiple sub-contaminants 90', 90", which are similarly prevented from reaching the cavity 24 of the enclosure 10.

FIGS. 8 and 9 further demonstrate the louvered panel assembly's 28 ability to handle contaminants entering at angles other than normal to the louvered panel assembly 28. Due to the shape of the louvers 68 and the size and location of the openings 72 in the first louvered panel 58, contaminants 100 entering at a majority of angles are prevented from even passing beyond the first louvered panel 58 in the assembly. As illustrated in FIG. 9, contaminants 100 will be prevented from passing beyond even the first louvered panel 58 unless they are being propelled within the maximum intrusion angle α. The maximum intrusion angle α can be between about 75 degrees and about 90 degrees, and can be about 83 degrees, or more or less. The downward orientation of the louvers 68 and the location of the openings 72 largely restricts contaminants 100 with a significant downward velocity component (e.g., falling rain, snow) from entering the enclosure 10 altogether. As demonstrated by FIG. 9, contaminants 100 entering at the minimum and maximum (e.g., 0 degrees and 83 degrees) of the intrusion angle α are unlikely to pass to the secondary filter 66 or the third louvered panel 62, as they will be redirected (and slowed down) by the louvered panels 58, 60 several (e.g., five or more) times before finally escaping through an opening 72 in either of the first two louvered panels 58, 60. No matter the approach angle, the louvered panel assemblies 28 are able to reduce and dispose of contaminants 90, 100 by breaking the wind velocity and redirecting the contaminant repeatedly.

Figure 10A:
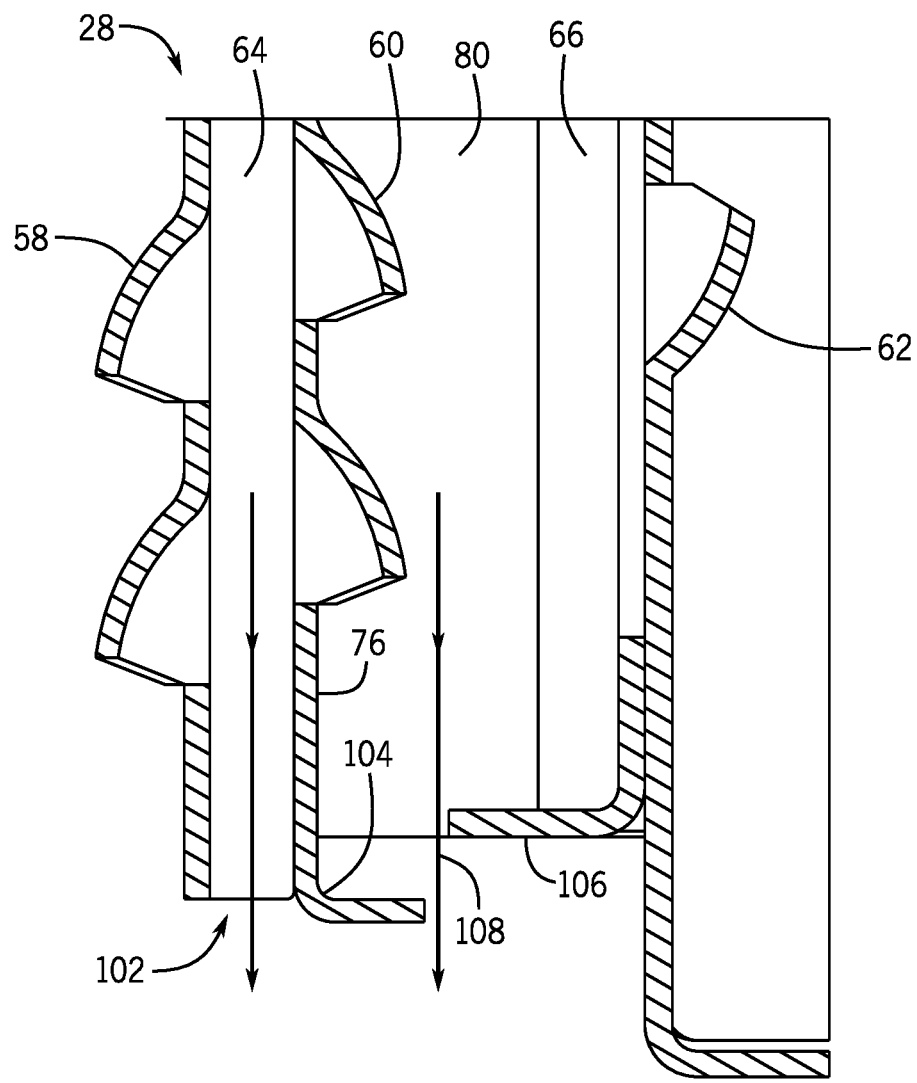
FIG. 10A is a side view of a louvered panel assembly shown in FIG. 2A and taken from section 10A-10A, showing an exemplary contaminant drainage path.
Figure 10B:
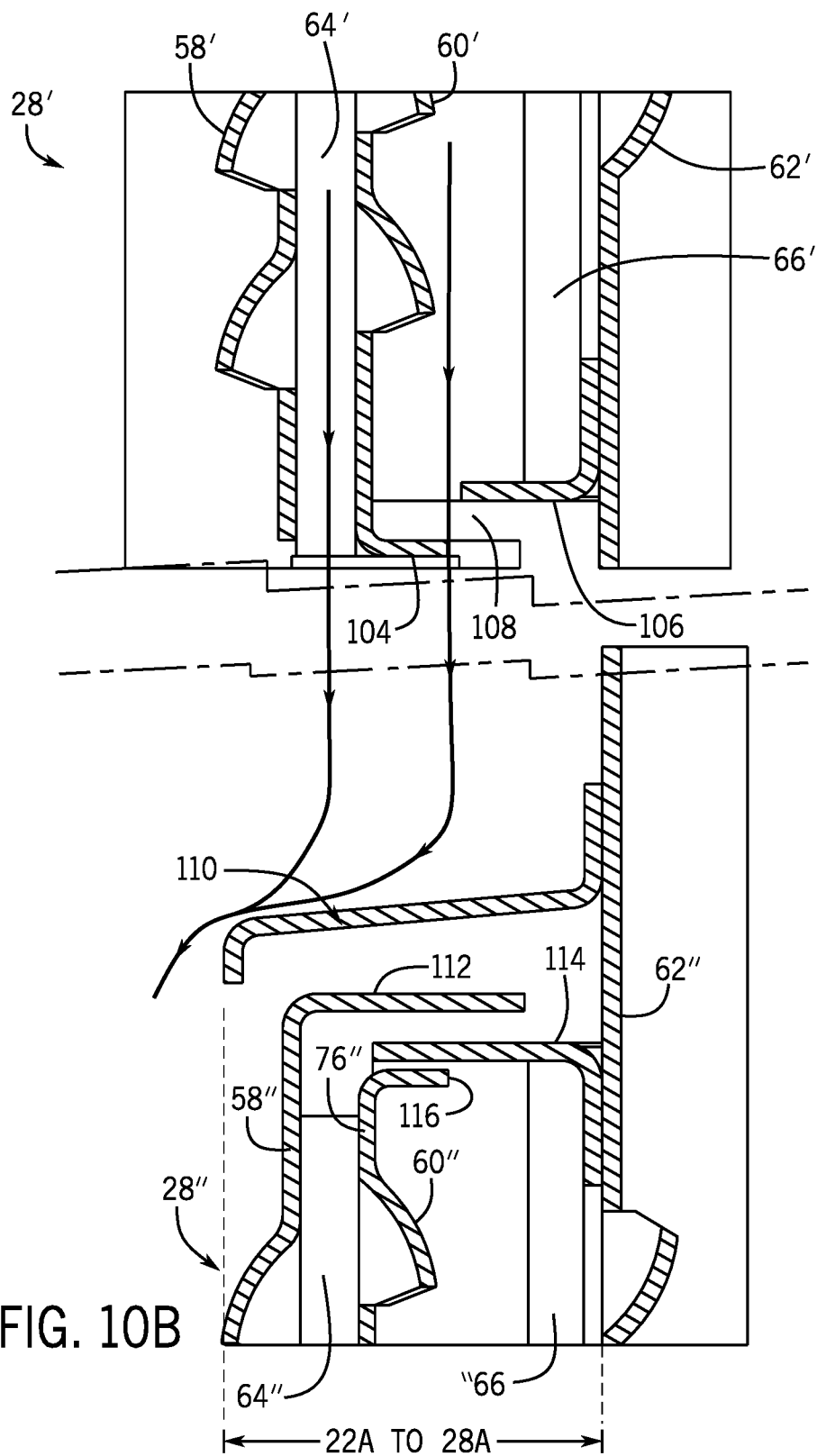
FIG. 10B is a side view of a louvered panel assembly shown in FIG. 2A and taken from section 10B-10B further incorporating a drip shield.

Once the energy of the intruding contaminants 90, 100 has been reduced, the contaminants can be removed from the enclosure 10, as shown in FIGS. 10A and 10B. In order to promote adequate drainage and prevent pooling or localized flooding within the ventilated outdoor enclosure 10, the contaminants are directed both downward and outward, away from the enclosure 10. In some embodiments of the louvered panel assembly 28, an opening 102 is present between the bottom of the first louvered panel 58 and the bottom of the second louvered panel 60. Any liquids trapped or otherwise suspended in the primary filter 64 will naturally drain downward, through the filter 64, and out of the opening (and therefore, the louvered panel assembly 28).

Particles that pass inwardly beyond the primary filter 64 and second louvered panel 60 can be expelled from the enclosure 10 as well. In some embodiments, a ramp 104 extends downwardly and inwardly away from the plate 76, to direct contaminants away from the second louvered panel 60. The ramp 104 can act as a gutter, for example. A second, larger ramp 106 can be coupled proximate the bottom of the plate 84 of the third louvered panel 62. The second ramp 106 can be vertically offset from the first ramp 104, and can include a larger horizontal component than the first ramp 104, for example. In some aspects, a horizontal gap 108 exists between the first ramp 104 and the second ramp 106, which allows for contaminants to drain outward from the area between the second louvered panel 60 and the third louvered panel 62. The second ramp 106 can also support the secondary filter 66, while simultaneously directing liquid draining out of the secondary filter 66 and toward the horizontal gap 108, where it can exit the louvered panel assembly 28.

To ensure that contaminants drained away from the upper louvered panel assembly 28' do not pool within or directly enter the lower louvered panel assembly 28", a drip shield 110 can be placed between the louvered panel assemblies 28', 28". The drip shield 110 can be a unitary component provided with an "S"-shape through various processes, such as molding, stamping, or otherwise bending. The drip shield 110 can extend slightly downward and outward from the enclosure 10, for example, to receive and direct contaminants drained through the opening 102 and the horizontal gap 108 away from top surface of the louvered panel assembly 28". The drip shield 110 can extend outwardly away from the third louvered panel 62" of the lower louvered panel assembly 28", and can have a horizontal length of between about 22 and about 28 times larger than the vertical length A of the openings 72 in the louvered panels 58, 60, 62.

The tops of the louvered panels 58, 60, 62 can be designed to further prevent contaminants from entering the enclosure 10 vertically. For example, a tab 112 can extend inwardly away from the first louvered panel 58", above the second louvered panel 60" and primary filter 64". An arm 114 can extend away from the third louvered panel 62". The arm 114 has a horizontal overlap with the tab 112, but is vertically offset (e.g., lower) from the tab 112. The top of the second louvered panel 60" can also include an inward projection 116, which extends horizontally inward from the plate 76". In some embodiments, the projection 116 extends in the same direction as the tab 112, and is parallel to and below the tab 112. The combination of the tab 112, the arm 114, and the projection 116 inhibit the travel of contaminants there through, while still maintaining airflow within the louvered panel assemblies 28', 28".

Figure 11:
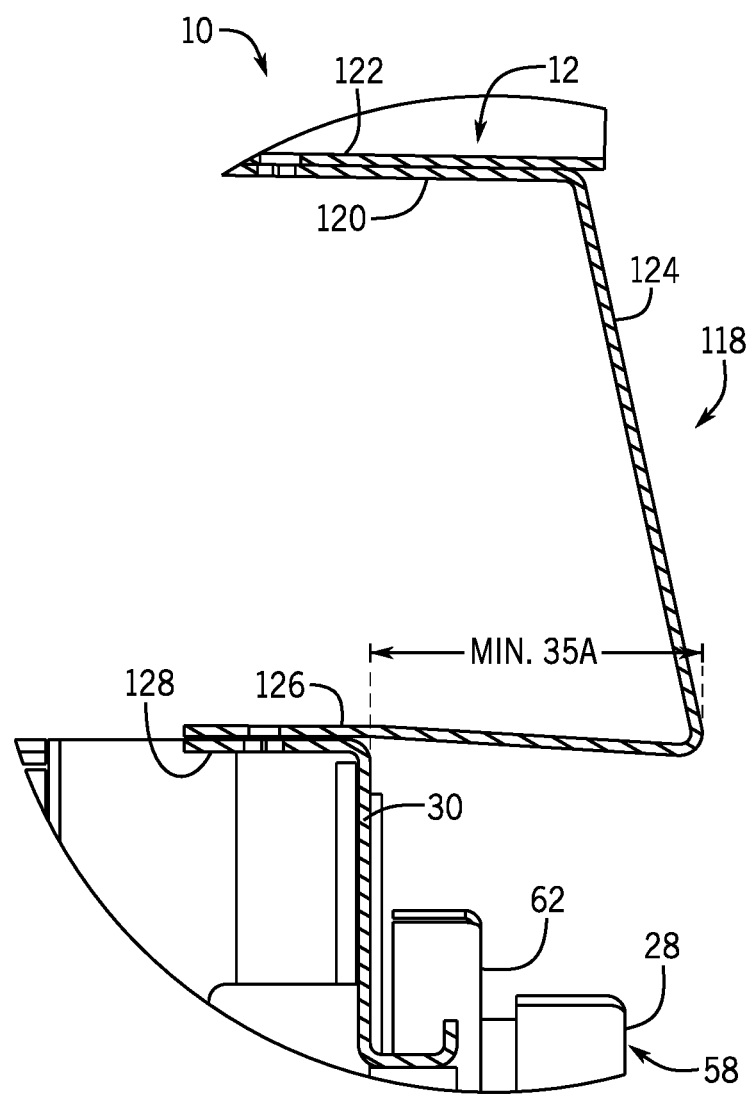
FIG. 11 is a side view of an example roof drip edge that is incorporated on the outdoor ventilated enclosure of FIG. 2A, taken from section 11-11.

Additional drainage mechanisms can be coupled to the enclosure 10 to further inhibit the ingress of contaminants into the cavity 24. As shown in FIG. 11, a drip edge 118 can be coupled to the top panel 12 to direct contaminants off the top panel 12 and outwardly away from the enclosure 10. The drip edge 118 may be added to the outdoor ventilated enclosure 10 to ensure that any rain or snow collecting on the top side 12 (e.g., the roof) will bypass the openings in the louvered panel assemblies 28 below while the contaminants are being directed off the enclosure 10. The drip edge 118 can be bolted or otherwise coupled to the top side 12 of the enclosure 10, and can be defined by a shape that extends forwardly past the outer edge of the first louvered panel 58.

The drip edge 118 can be defined by a mounting flange 120 that extends approximately parallel to the top side 12 of the enclosure 10. In some aspects, the top side 12 can also be provided with a sloped roof 122, which further promotes precipitation runoff. A forwardly-angled face 124 extends forwardly and downwardly away from the mounting flange 120. The forwardly-angled face 124 can extend outward beyond the louvered panel assemblies 28, to a distance that can be at least about 35 times larger than the vertical length A of the opening 72, for example. A second mounting flange 126 extends inwardly away from the forwardly-angled face 124 to present a flat mating surface for coupling to the louvered panel assembly 28. In some embodiments, a mounting bracket 128 is coupled to the third louvered panel 62, which can receive and secure the drip edge 118. The drip edge 118 can be a unitary component stamped, folded, or cast to shape, for example.

Figure 12A:
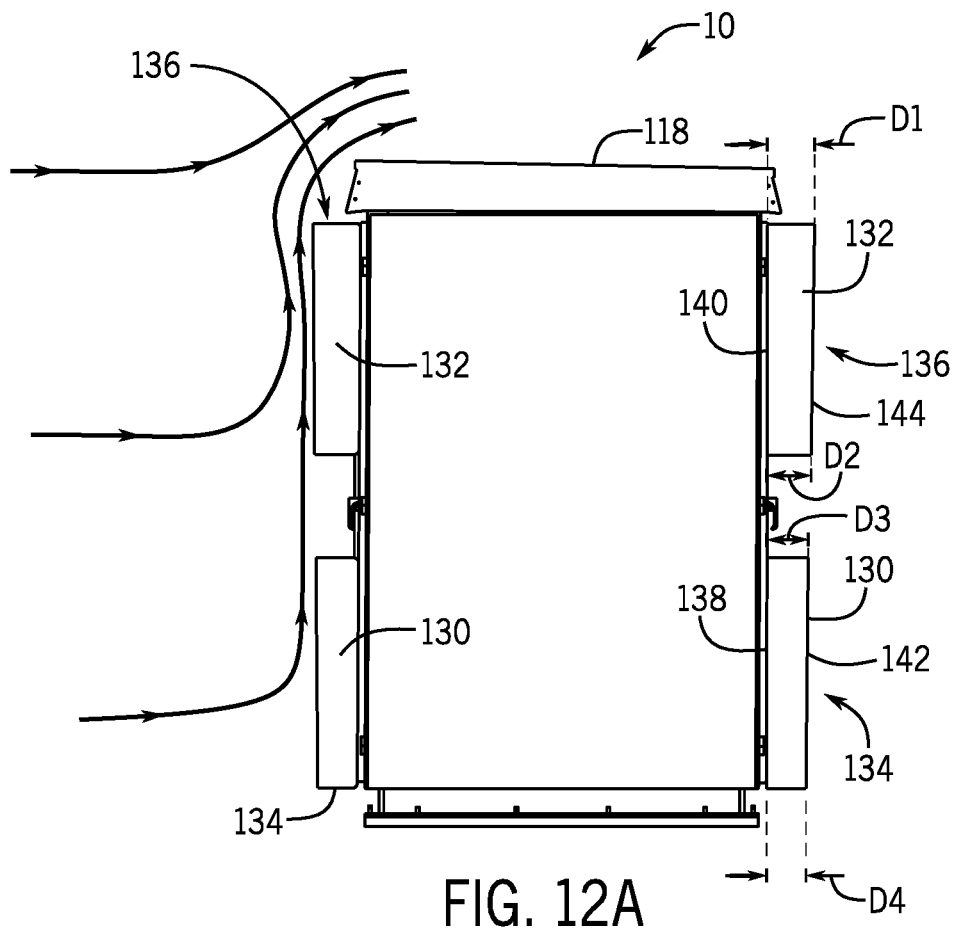
FIG. 12A is a side view of a storm guard assembly that may be incorporated onto the outdoor ventilated enclosure of FIG. 1.
Figure 12B:
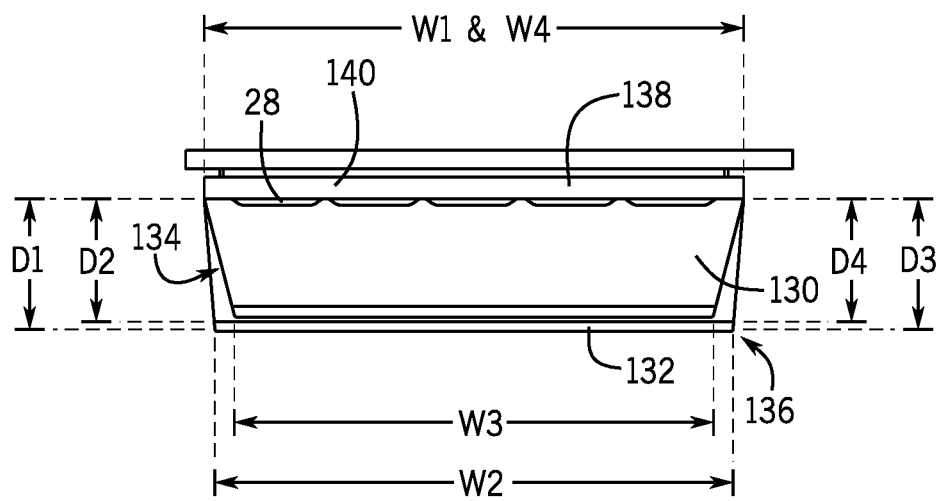
FIG. 12B is a bottom view of the storm guard assembly that may be incorporated onto the outdoor ventilated enclosure of FIG. 1.

To provide further protection in severe weather conditions, storm guard assemblies 130, 132, as shown in FIGS. 12A and 12B, can be added to the enclosure 10. The storm guard assemblies 130, 132 may be designed to direct blowing rain or snow away from the enclosure 10, and can protect the louvered panel assemblies 28 in even the most extreme weather conditions. The storm guard assemblies 130, 132 each can have a hollow, open-base trapezoid that has outwardly tapering sides 134, 136 to direct high velocity winds and contaminants outwardly away from the enclosure 10. The wider end 138, 140 of each trapezoid is open and can attach to the louvered panel assemblies 28. The lower storm guard assemblies 130 can be designed slightly smaller than the top storm guard assemblies 132 so the rain or snow that is deflected by the top storm guard assemblies 132 does not fall onto the bottom storm guard assemblies 130. The larger, upper storm guard 132 and the lower, smaller storm guard assembly 130 can have a base width W1, W4 approximately equal in size. The tapered walls 134, 136 extend away from the wider ends 138, 140 to a flat, rear surface 142, 144. The rear surface 144 of the larger, upper storm guard assembly 132 extends outwardly to a distance D1 that tapers inwardly to a distance D2. The rear surface 142 of the smaller, lower storm guard assembly 130 extends outwardly to a distance D3 that tapers inwardly to a distance D4, both of which are smaller than the distance D2. The flat rear surface 142 of the smaller, lower storm guard assembly 130 can be defined by a width W3 that is smaller than a width W2 that defines the rear surface 144 of the top storm guard assembly 132. The dimensional relationships between the storm guard assemblies 130, 132 make the depth at the top of the storm guard assemblies 130, 132 greater than the depth at the bottom of the storm guard assemblies 130, 132. The storm guard assemblies 130, 132 may comprise aluminum or other corrosion-resistant materials, including galvanized sheet metal, stainless steel, or thermoplastics that can be bent or otherwise formed to the desired shape (e.g., the open-base trapezoid).

The storm guard assemblies 130, 132 can be securely and removably coupled to each of the louvered panel assemblies 28 using fasteners or mounting brackets (not shown), for example. When severe weather is expected, storm guard assemblies 130, 132 can be individually coupled to each louvered panel assembly 28 on the enclosure 10. The solid, rear surfaces 142, 144 can restrict air flow from the external environment into the cavity 24, and can direct high velocity winds upwardly away from the enclosure 10 during stormy conditions. Once the severe weather conditions have ceased, the storm guard assemblies 130, 132 can be removed from each louvered panel assembly 28, so that normal air flow (and natural cooling) through the enclosure 10 can resume.

Example

The University of Ontario Institute of Technology subjected the above-described enclosure 10 to several severe weather simulations to prove the efficacy of the louvered panel assembly 28 concept. The testing measured the effectiveness of the outdoor ventilated enclosure 10 in simulated weather conditions, including falling snow, blowing snow, and blowing rain. During the blowing rain and blowing snow tests, the outdoor ventilated enclosure 10 experienced heavy precipitation at high wind velocities (e.g., wind speeds up to around 90 kilometers per hour) at various angles of incidence (e.g., normal to the louvered panel assemblies, about 45 degrees relative to the louvered panel assemblies, and otherwise). The outdoor ventilated enclosure was tested with and without storm guards, and proved to be effective at keeping moisture and precipitation outside of the interior cavity of the enclosure even at intense simulated weather conditions. No intrusion into the cavity 24 of the enclosure 10 occurred in the blowing snow test, which subjected the enclosure 10 to over 15 centimeters of snow during the course of 2 hours, blowing at speeds up to 52 kilometers per hour. The enclosure 10 proved similarly effective at inhibiting rain from entering into the cavity 24, even when blowing at speeds of 52 kilometers per hour at angles normal and 45 degrees to normal from the enclosure 10.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto. The entire disclosure of each patent and publication cited herein is incorporated by reference, as if each such patent or publication were individually incorporated by reference herein. Various features and advantages of the invention are set forth in the following claims.

The invention claimed is:

1. A louvered panel assembly for restricting the ingress of contaminants into an enclosure, the louvered panel assembly comprising: a first louvered panel having a first plurality of louvers extending arcuately, downwardly, and outwardly away from a first plate; a second louvered panel coupled to the first louvered panel and having a second plurality of louvers extending arcuately, downwardly, and inwardly away from a second plate that is spaced apart from the first plate; and a third louvered panel coupled to the second louvered panel and having a third plurality of louvers extending arcuately, upwardly, and inwardly away from a third plate that is spaced apart from and extends approximately parallel to the second plate, a secondary filter received between the second plate and the third plate, wherein the first plate and the second plate are spaced apart by a first distance, and the second plate and the third plate are spaced apart by a second distance longer than the first distance, and wherein the secondary filter is positioned proximate the third plate and spaced apart from the second plate.

2. The louvered panel assembly of claim 1, further comprising a primary filter received between the first plate and the second plate.

3. The louvered panel assembly of claim 1, wherein the second distance is at least 2.5 times longer than the first distance.

4. The louvered panel assembly of claim 1, wherein a first plurality of openings are formed between a distal end of the first plurality of louvers and the first plate.

5. The louvered panel assembly of claim 4, wherein a second plurality of openings are formed between a distal end of the second plurality of louvers and the second plate.

6. The louvered panel assembly of claim 5, wherein the first plurality of openings are vertically offset from the second plurality of openings.

7. The louvered panel assembly of claim 6, wherein each of the first plurality of openings are vertically offset from each of the second plurality of openings by a distance of between 3 and 8 times larger than a vertical length of each of the first plurality of openings.

8. The louvered panel assembly of claim 5, wherein a third plurality of openings are formed between a distal end of the third plurality of louvers and the third plate.

9. The louvered panel assembly of claim 8, wherein the first plurality of openings, the second plurality of openings, and the third plurality of openings are each vertically offset from one another.

10. The louvered panel assembly of claim 1, wherein each louver in the first plurality of louvers, the second plurality of louvers, and the third plurality of louvers are uniformly shaped.

11. The louvered panel assembly of claim 10, wherein openings are formed between a distal end of each louver and each plate from which the louver extends.

12. The louvered panel assembly of claim 11, wherein each louver has a vertical length of between about 8 and 12 times larger than a vertical length of each opening.

13. An outdoor ventilated enclosure for housing and protecting a transformer, the enclosure comprising: a plurality of walls defining a cavity therein to receive the transformer; and a louvered panel assembly coupled to the plurality of walls and defining a fluid flow path through the wall to the cavity, the louvered panel assembly comprising: a first louvered panel having a first plurality of louvers extending outwardly and downwardly away from a first plate, the first plate extending approximately parallel to the wall; a second louvered panel coupled to and positioned inward from the first louvered panel, the second louvered panel having a second plurality of louvers extending downwardly and inwardly away from a second plate toward the cavity, the second plate extending approximately parallel to the first plate; and a third louvered panel coupled to and positioned inward from the second louvered panel, the third louvered panel having a third plurality of louvers extending upwardly and inwardly away from a third plate, toward the cavity, the third plate extending approximately parallel to the second plate, a secondary filter is positioned between the second plate and the third plate, and wherein the secondary filter is positioned proximate the third plate and spaced apart from the second plate.

14. The enclosure of claim 13, wherein a primary filter is positioned between the first plate and the second plate.

15. The enclosure of claim 13, wherein a drip shield is coupled to the third louvered panel, the drip shield extending forwardly beyond and above the first plurality of louvers.

16. The enclosure of claim 13, wherein a drip edge is coupled to a top wall of the enclosure, the drip edge extending above and forwardly beyond the louvered panel assembly.

* * * * *

UNITED STATES PATENT AND TRADEMARK OFFICE
CERTIFICATE OF CORRECTION

PATENT NO. : 11,439,038 B2
APPLICATION NO. : 16/044842
DATED : September 6, 2022
INVENTOR(S) : Dhiru S. Patel et al.

It is certified that error appears in the above-identified patent and that said Letters Patent is hereby corrected as shown below:

In the Claims

Column 14, Claim 13, Line 4, "to the" should be --to one of the--.

Signed and Sealed this
Eighth Day of November, 2022

*Katherine Kelly Vidal*

Katherine Kelly Vidal
*Director of the United States Patent and Trademark Office*